United States Patent
Omote et al.

(10) Patent No.: US 8,487,050 B2
(45) Date of Patent: Jul. 16, 2013

(54) COMPOSITION CONTAINING FLUORINE-CONTAINING AROMATIC POLYMER AND LAMINATED BODY CONTAINING FLUORINE-CONTAINING AROMATIC POLYMER

(75) Inventors: Kazushi Omote, Nara (JP); Ai Nishichi, Osaka (JP); Shimpei Sato, Suita (JP)

(73) Assignee: Nippon Shokubai Co., Ltd., Osaka (JP)

( * ) Notice: Subject to any disclaimer, the term of this patent is extended or adjusted under 35 U.S.C. 154(b) by 831 days.

(21) Appl. No.: 11/913,015

(22) PCT Filed: Apr. 27, 2006

(86) PCT No.: PCT/JP2006/309205
§ 371 (c)(1),
(2), (4) Date: Jan. 9, 2009

(87) PCT Pub. No.: WO2006/118323
PCT Pub. Date: Nov. 9, 2006

(65) Prior Publication Data
US 2009/0169905 A1    Jul. 2, 2009

(30) Foreign Application Priority Data

Apr. 28, 2005  (JP) ................................. 2005-132864
Apr. 28, 2005  (JP) ................................. 2005-133130

(51) Int. Cl.
*C08G 65/48* (2006.01)

(52) U.S. Cl.
USPC ..................... 525/396; 156/272.2; 428/473.5; 428/696; 524/114; 525/403; 525/534; 528/86; 528/401

(58) Field of Classification Search
USPC ............. 156/272.2; 428/473.5, 696; 524/114; 525/396, 403, 534; 528/86, 401
See application file for complete search history.

(56) References Cited

U.S. PATENT DOCUMENTS 5,494,977 A * 2/1996 Harano et al. ................ 525/438

FOREIGN PATENT DOCUMENTS

| JP | 09-034133 | | 2/1997 |
| JP | 2001-049110 | | 2/2001 |
| JP | 2002-256058 | | 9/2002 |
| JP | 2003-183495 | * | 7/2003 |
| JP | 2003-277473 | | 10/2003 |

OTHER PUBLICATIONS

Haris, A.; Adachi, T.; Araki, W.; Journal of Materials Science, 2008, p. 3289-3295.*
Ennajih, H.; Bouhfid, R.; Zouihri, H.; Essassi, E.M.; Ng, S.W.; Acta Crystallographica Section E, 2010, p. o455.*

* cited by examiner

*Primary Examiner* — Robert Jones, Jr.
(74) *Attorney, Agent, or Firm* — Novak Druce Connolly Bove + Quigg LLP

(57) ABSTRACT

A composition comprises a fluorine-containing aromatic polymer, an epoxy compound and an initiator. Its use as film, laminate with polyimide or copper foils, copper-clad laminated board and adhesive film. The fluorine-containing aromatic polymer is preferably a fluorine-containing aryl ether polymer. The initiator is preferably a cationic initiator.

7 Claims, No Drawings

US 8,487,050 B2

COMPOSITION CONTAINING FLUORINE-CONTAINING AROMATIC POLYMER AND LAMINATED BODY CONTAINING FLUORINE-CONTAINING AROMATIC POLYMER

This application is a national phase of PCT/JP2006/309205, filed on Apr. 27, 2006, which claims priority to JP 2005-132864, filed Apr. 28, 2005, and JP 2005-133130, filed Apr. 28, 2005, the entire contents of all are hereby incorporated by reference.

TECHNICAL FIELD

The present invention relates to a composition containing a fluorine-containing aromatic polymer and a laminated body containing a fluorine-containing aromatic polymer. More specifically, the present invention relates to a composition containing a fluorine-containing aromatic polymer and a laminated body containing a fluorine-containing aromatic polymer, the composition and the laminated body being used in applications such as electronic material fields.

BACKGROUND ART

As many electric products have been electronically controlled, circuit boards supporting such electronic control are also increasingly used for more various products recently. A flexible print circuit board as one of the circuit boards is a circuit board formed by attaching a plastic film of polyimide and the like to a metal such as a copper foil. The flexible print circuit board is exposed to relatively high temperatures. Therefore, heat resistance as well as excellent adhesion property is required for an adhesive composition used for formation of the circuit board.

An acrylic resin, a polyester resin, a rubber-epoxy resin and the like have been conventionally used as the adhesive composition for the flexible print circuit board. Such an adhesive composition is insufficient in solder reflow required for the adhesive composition for the flexible print circuit board because the resin itself used in the composition has low heat resistance. With the problem, adhesive compositions prepared using an aromatic polyamide resin, an aromatic polyimide resin, or the like, which has relatively high heat resistance, have been used recently. However, in such adhesive compositions prepared using an aromatic polyamide resin, an aromatic polyimide resin, or the like in view of the heat resistance, the resin itself has high hygroscopicity. Therefore, absorbent moisture in the adhesive compositions is heated at the time of soldering, and thereby adhesive agents possibly generate blister, resulting in deterioration of adhesive force.

With respect to a resin composition which can be used for such adhesive compositions, Japanese Kokai Publication No. 2003-183495 disclosed is a fluorine compound-containing resin composition containing fluorine-containing poly(ether keton)s and/or poly(ether nitrile)s, and an epoxy resin and/or a phenol resin at a specific compounding ratio. However, the resin composition has room for improvement such that the resin composition has more improved adhesion property to a base material without decrease in heat resistance and can be a resin composition for providing an adhesive composition preferably used to various base materials.

SUMMARY OF THE INVENTION

The present invention has been made in view of the above-mentioned state of the art. The present invention has an object to provide: a composition, which is excellent in heat resistance and adhesion property to a circuit board used in electronic material fields and can be used on the circuit board as a protective layer of the board or an adhesive agent; and a laminated body, which has low hygroscopicity and excellent heat resistance and adhesion property to the board and can be used as a protective layer or an adhesive layer of the board.

The present inventors have made various investigations about a composition which is excellent in heat resistance and adhesion property to a base material and can form a layer, which can be used as an adhesive agent, on a base material such as a circuit board. The present inventors have considered the following three measures for providing such a composition: (1) introducing a functional group for improving adhesion property into a polymer used as a constitutional component of such a composition; (2) adding a component for exhibiting heat resistance and a component for exhibiting adhesion property in such a composition; and (3) treating a composition at a temperature of a melting point or more of a thermoplastic polymer contained in such a composition to exhibit adhesion property. However, in the measure (1), if a functional group for improving adhesion property, such as a hydrogen group and an amino group, is introduced into a polymer, the polymer easily absorbs moisture, possibly resulting in generation of blisters at the time of soldering of a circuit board. In the measure (2), a cured product of an epoxy compound may be mentioned as the component for exhibiting adhesion property. However, there is the following problem. The adhesion property is improved but the curing product becomes hard-brittle if a component of the cured product of the epoxy compound is increased. On the other hand, the adhesion property decreases if the component of the cured product of the epoxy compound is decreased. In the measure (3), there is the following problem. If a laminated body or an adhesive film is formed on a device using a thermoplastic polymer, the polymer is conventionally treated at a temperature of a melting point or more of the polymer to be attached to the device. However, if a temperature in preparation step of the device is the melting point or more of the polymer, the laminated body or the adhesive film may be significantly misaligned because a layer containing the polymer becomes liquid state and easily moves.

The present inventors have noted that a fluorine-containing aromatic polymer is a compound with heat resistance. They have found that in a composition prepared by adding a fluorine-containing aromatic polymer and an initiator into an epoxy compound, use of the epoxy compound in an amount less than that of a curing composition of an epoxy compound and a phenol compound, which is conventionally known, can secure adhesion property to a base material of the composition. Therefore, a compounding ratio of the fluorine-containing aromatic polymer is raised, and thereby, a composition, which eliminates the hard-brittle property while securing adhesion property to a base material, can be provided. Such a composition exhibits sufficient adhesion property without introduction of the functional group for improving adhesion property into the polymer. Therefore, blisters in the layer of the composition formed on the circuit board caused by absorption of the polymer at the time of soldering, can be prevented.

Furthermore, the present inventors have found that a fluorine-containing aromatic polymer whose melting point is not observed exhibits adhesion property to a base material by being treated at a temperature of a glass transition temperature or more of the polymer, although such a polymer does not exhibit adhesion property usually. They have also found that if a laminated body is formed on a device using a fluorine-containing aromatic polymer whose melting point is not observed as the fluorine-containing aromatic polymer, generation of the misalignment of the laminated body or the adhesive film can be prevented because the fluorine-containing aromatic polymer does not melt into a liquid state by heating in the preparation step of the device and they have found that thus-prepared laminated body is excellent in heat resistance, low hygroscopicity, and adhesive property to a base material. Thereby, the above-mentioned problems have been solved, leading to completion of the present invention.

That is, the present invention is a composition containing a fluorine-containing aromatic polymer, wherein the composition contains a fluorine-containing aromatic polymer, an epoxy compound and an initiator.

The present invention is also a laminated body prepared by laminating the composition containing the fluorine-containing aromatic polymer of the present invention on a base material.

Further, the present invention is a laminated body prepared by laminating a layer containing a fluorine-containing aromatic polymer on a base material, wherein a melting point of the fluorine-containing aromatic polymer is not observed until a decomposition temperature of the polymer.

Further, the present invention is a production method of the laminated body of the present invention, wherein the production method comprises a step of subjecting the laminated body to heating treatment at a temperature of a glass transition temperature or more of the fluorine-containing aromatic polymer.

Further, the present invention is an adhesive film containing a fluorine-containing aromatic polymer whose melting point is not observed until a decomposition temperature of the polymer.

DETAILED DESCRIPTION OF THE INVENTION

The present invention will be, hereinafter, described in more detail.

The composition containing a fluorine-containing aromatic polymer of the present invention contains a fluorine-containing aromatic polymer, an epoxy compound, and an initiator. The compounding ratio of these components is appropriately determined depending on an application of the composition, and the like. The ratio of the fluorine-containing aromatic polymer to the epoxy compound (the fluorine-containing aromatic polymer/the epoxy compound) is preferably 20/80 to 98/2, and more preferably 40/60 to 95/5. If the ratio of the fluorine-containing aromatic polymer to the epoxy compound is more than 98/2, a cured product prepared by curing the composition may exhibit insufficient adhesion property to a base material. If the ratio of the fluorine-containing aromatic polymer to the epoxy compound is less than 20/80, the cured product may exhibit insufficient heat resistance. The initiator is preferably 0.5 to 10% relative to the epoxy compound, and more preferably 1 to 7%.

Each of the fluorine-containing aromatic polymer, the epoxy compound, and the initiator, which are contained in the composition may be one kind or two or more kinds. The composition containing the fluorine-containing aromatic polymer may contain another component as long as the composition contains these three components.

It is preferable that the above-mentioned fluorine-containing aromatic polymer is a fluorine-containing aryl ether polymer. The fluorine-containing aryl ether polymer has solubility in addition to heat resistance or low hygroscopicity and can be easily mixed with the epoxy compound, the initiator, and further has excellent electric property. Therefore, use of the fluorine-containing aryl ether polymer makes it possible to provide a composition excellent in electric property in addition to heat resistance, adhesion property to a base material and low hygroscopicity.

The above-mentioned epoxy compound contained in the composition containing the fluorine-containing aromatic polymer may be a compound, which has an epoxy group in the structure and can be cured by the initiator. A compound, which easily exhibits adhesion property to a base material such as a polyimide and a copper foil, is preferable. Among such an epoxy compound, a low to medium molecular weight epoxy compound having a molecular weight of less than 3000 is preferred than a high molecular weight epoxy compound having a molecular weight of 3000 or more. If the low to middle molecular weight epoxy compound is used, the composition is polymerized while moving over a base material surface when applied to the base material. Thereby, the composition can exhibit higher adhesion property.

Various kinds of epoxy resins and the like may be used as the epoxy compound of the present invention. Examples of such epoxy resins include glycidyl ethers such as bisphenol A diglycidyl ether, bisphenol F diglycidyl ether, bisphenol S diglycidyl ether, resol phenol diglycidyl ether, brominated bisphenol A diglycidyl ether, fluorinated bisphenol A diglycidyl ether, phenol novolak glycidyl ether, cresol novolak glycidyl ether, and brominated novolak glycidyl ether; glycidyl esters such as hexahydrophthalic acid diglycidyl ester, phthalic acid diglycidyl ester, and dimer acid diglycidyl ester; glycidyl amines such as triglycidyl isocyanurate, tetraglycidyl diaminodiphenylmethane, and tetraglycidyl m-xylylenediamine; linear aliphatic epoxides such as epoxidized polybutadiene, and epoxidized soybean oil; and alicyclic epoxides such as 3,4-epoxy-6-methylcyclohexyl methyl carboxylate, and 3,4-epoxy cyclohexyl methyl carboxylate.

The composition containing the fluorine-containing aromatic polymer of the present invention may contain one or two or more kinds of epoxy resins such as the above-mentioned epoxy resins. It is preferable that the composition contains one or more kinds of polyfunctional epoxy compound having two or more functional groups. If the composition containing the fluorine-containing aromatic polymer contains only monofunctional epoxy resin, the composition may exhibit insufficient heat resistance.

The above-mentioned initiator is not especially limited as long as the initiator can cure the epoxy compound. It is preferable that the above-mentioned initiator is a cation initiator. The cation initiator is not especially limited as long as the cation initiator can initiate a cation polymerization. Examples of such a cation initiator include a diazonium salt compound represented by the following general formula (1), an iodonium salt compound represented by the following general formula (2), and a sulfonium salt compound represented by the following general formula (3).

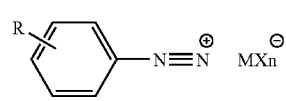

(1)

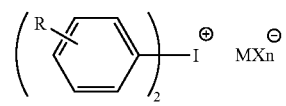

(2)

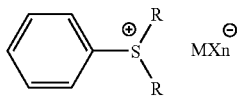

(3)

In the formula, R represents an alkyl group or an aromatic group; and MXn represents a counter anion.

$BF_4$, $PF_3$, $A_sF_6$, $SbF_6$, and the like may be mentioned as such a counter anion.

Specific examples of the initiator contained in the composition containing the fluorine-containing aromatic polymer of the present invention include ADEKA OPTOMER SP-series and ADEKA OPTOPN CP-series (product of Asahi Denka Co., Ltd) and San-Aid SI series (product of SANSHIN CHEMICAL INDUSTRY Co., Ltd).

The composition containing the fluorine-containing aromatic polymer of the present invention can be used in the form of a film. Such a film containing the composition containing the fluorine-containing aromatic polymer of the present invention is also part of the present invention.

The present invention is also a laminated body prepared by laminating the composition containing the fluorine-containing aromatic polymer on a base material.

As mentioned above, the cured substance which contains the fluorine-containing aromatic polymer and is prepared by curing the epoxy compound and which is prepared from the composition containing the fluorine-containing aromatic polymer, the epoxy compound and the initiator, is excellent in heat resistance and low hygroscopicity and shows high adhesion property to a base material. Therefore, the composition containing the fluorine-containing aromatic polymer can be used as a layer-forming material for forming a layer with the above-mentioned various properties on a base material.

As methods for forming a layer of the layer-forming material containing the composition containing the fluorine-containing aromatic polymer of the present invention on a base material, used may be methods, in which the layer-forming material is dissolved in a solvent and the prepared solution is applied on a base material to form a coating film, and then the coating film is dried by heating to remove the solvent.

Various solvents may be used for the dissolution of the layer-forming material containing the composition containing the fluorine-containing aromatic polymer of the present invention because the fluorine-containing aromatic polymer has high solubility in various solvents. Examples of such solvents include halogenated hydrocarbons such as chloroform, dichloromethane, carbon tetrachloride, dichloroethane, tetrachloroethane, trichloroethylene, tetrachloroethylene, chlorobenzene, and o-dichlorobenzene; aromatic hydrocarbons such as benzene, toluene, xylene, methoxybenzene, and 1, 2-dimethoxybenzene; ketone solvents such as acetone, methyl ethyl ketone, methyl isobutyl ketone, cyclohexanone, cyclopentanone, 2-pyrrolidone, and N-methyl-2-pyrrolidone; ester solvents such as ethyl acetate, and butyl acetate; amide solvents such as dimethylformamide, and dimethylacetamide; nitrile solvents such as acetonitrile and butyronitrile; ether solvents such as diethyl ether, dibutyl ether, tetrahydrofuran, and dioxane; carbon disulfide; ethyl Cellosolve; and butyl Cellosolve. These solvents may be used singly or in combination.

Among the above-mentioned solvents, hydrocarbon solvents such as halogen solvent and aromatic solvent, ester solvents and ether solvents are preferred as the solvent for dissolving the layer-forming material containing the fluorine-containing polymer composition of the present invention. Polar solvents have high solubility, and therefore concentration adjustment is easily performed. However, the polar solvents may have hygroscopicity. Therefore, it is preferable that a hydrophobic solvent is used in combination with the polar solvent, if the polar solvent is used. More preferably, a hydrophobic solvent having a boiling point higher than that of the polar solvent is used. The compounding ratio of the polar solvent to the hydrophobic solvent is appropriately determined depending on a concentration of a needed solution of the layer-forming material.

In the solution in which the above-mentioned layer-forming material is dissolved, the fluorine-containing aromatic polymer has a concentration of 1% by weight or more and 50% by weight or less. If the concentration is 50% by weight or more, the fluorine-containing aromatic polymer is insufficiently dissolved in the solvent. If the concentration is 1% by weight or less, the layer of the cured substance with sufficient thickness may not be prepared. More preferably, the concentration is 5% by weight or more and 40% by weight or less.

It is preferable that the layer being formed on a base material from the above-mentioned layer-forming material has a thickness of 1 μm or more and 100 μm or less. More preferably, the layer has a thickness of 3 μm or more and 60 μm or less. The composition containing the fluorine-containing aromatic polymer of the present invention is soluble in the solvent and can be cast. Therefore, the thickness can be optionally adjusted, and thereby any laminated body can be formed.

As methods for the application of the above-mentioned solution of the layer-forming material on a base material, used may be spin coating method, roll coating method, printing method, immersion and pull-up method, curtain coating method, wire bar coating method, doctor blade method, knife coating method, die coating method, photogravure coating method, micro gravure coating method, offset gravure coating method, lip coating method, and spray coating method.

For preparing the layer of the composition containing the fluorine-containing aromatic polymer of the present invention by drying the coating film of the solution of the layer-forming material applied on a base material as mentioned above, the coating film may be dried by high temperature heating for performing removal of the solvent and acceleration of the curing simultaneously, or may be dried by heating separately for removal of the solvent and for acceleration of the curing. The temperature at the heating for removal of the solvent and acceleration of the curing is appropriately determined depending on thickness of the layer formed on the base material, kind of the used solvent, kind of the used initiator, and the like. The heating may be performed one step or in multisteps. The temperature at the heating is preferably 120° C. or more. The time for heating is preferably 5 minutes or more, and more preferably 10 minutes or more.

In the laminated body prepared by laminating the layer-forming material containing the composition containing the fluorine-containing aromatic polymer of the present invention on a base material, the base material is not especially limited as long as it is not deformed by the above-mentioned heat treatment. Various materials, which can be used as a circuit board in electronic material fields, may be used, and their thickness and size and the like are not especially limited.

A polyimide, a copper foil, or the like, which is used for flexible printed circuit boards, is preferred as the base material used in the laminated body prepared by laminating the layer-forming material containing the composition containing the fluorine-containing aromatic polymer of the present invention on the base material. The laminated body formed by laminating the layer of the composition containing the fluorine-containing aromatic polymer of the present invention on a copper foil can be used as a copper foil with insulating layer.

It is preferable that the layer-forming material containing the fluorine-containing aromatic polymer of the present invention is used as an adhesive agent. The layer-forming material containing the fluorine-containing aromatic polymer of the present invention exhibit excellent adhesion property to the base material such as circuit board by cation curing of the epoxy compound. Also, the layer-forming material can exhibit heat resistance because the layer-forming material contains the fluorine-containing aromatic polymer. Therefore, the layer-forming material can be preferably used not only as a protective layer of the base material but also as an adhesive agent having heat resistance and low hygroscopicity.

A fluorine-containing aromatic polymer whose melting point is not observed until a decomposition temperature of the polymer also can form a laminated body excellent in heat resistance, low hygroscopicity and adhesion property to a base material by laminated on a base material, in addition to the above-mentioned composition containing the fluorine-containing aromatic polymer, the composition containing the fluorine-containing aromatic polymer, the epoxy compound, and the initiator.

Thus, the fluorine-containing aromatic polymer whose melting point is not observed until a decomposition temperature of the polymer of the present invention can be used as a layer-forming material for forming a layer with the above-mentioned various properties on a base material.

The laminated body prepared by laminating the layer containing the fluorine-containing aromatic polymer of the present invention on the base material, wherein a melting point of the fluorine-containing aromatic polymer is not observed until a decomposition temperature of the polymer may contain another component as long as the polymer contains the fluorine-containing aromatic polymer. One or two or more kinds of the fluorine-containing aromatic polymer may be contained.

The above-mentioned fluorine-containing aromatic polymer may be a fluorine-containing aromatic polymer whose melting point is not observed until a decomposition temperature of the polymer, that is, decomposition of the polymer is started before observation of peak of the melting point, if the melting point is identified with TGA. The decomposition temperature is preferably 350° C. or more, and more preferably 400° C. or more. If the decomposition temperature is the preferable temperature, the laminated body can be more preferably used on a circuit board.

A production method of the laminated body containing the fluorine-containing aromatic polymer whose melting point is not observed until a decomposition temperature of the polymer according to the present invention, comprises a step of subjecting the laminated body to heating treatment at a temperature of a glass transition temperature or more of the fluorine-containing aromatic polymer. The production method may comprise another step as long as the production method comprises the heating treatment step. In the step of subjecting the laminated body to heating treatment at a temperature of a glass transition temperature or more of the fluorine-containing aromatic polymer, the temperature in the treatment of the fluorine-containing aromatic polymer may be a temperature higher than a glass transition temperature of the polymer. If the layer contains two or more kinds of the fluorine-containing aromatic polymers, the temperature in the treatment may be a temperature higher than a glass transition temperature of at least one kind of the fluorine-containing aromatic polymer. However, it is preferable that the temperature in the treatment is a temperature higher than glass transition temperatures of much more kinds of the fluorine-containing aromatic polymer. The heating treatment is preferably performed at a temperature higher than a glass transition temperature of the polymer by 30° C. or more, and more preferably by 50° C. or more.

An upper limit of the temperature at the heating treatment is a decomposition temperature of the fluorine-containing aromatic polymer.

A time for the treatment at temperatures of a glass transition temperature or more is preferably 5 minutes or more, and more preferably 10 minutes or more.

The glass transition temperature of the fluorine-containing aromatic polymer can be identified with DSC, TMA, or the like.

As methods for forming a polymer layer (layer being formed from the layer-forming material according to the present invention), used may be methods, in which the layer-forming material containing the composition containing the fluorine-containing aromatic polymer is dissolved in a solvent and the prepared solution is applied on a base material to form a coating film, and then the coating film is dried by heating to remove the solvent.

In the production method of the laminated body containing the fluorine-containing aromatic polymer whose melting point is not observed until a decomposition temperature of the polymer according to the present invention, the above-mentioned solvents may be used as the solvent used for the dissolution of the layer-forming material containing the composition containing the fluorine-containing aromatic polymer. Preferable solvents are those mentioned above.

In the above-mentioned production method of the laminated body containing the fluorine-containing aromatic polymer whose a melting point is not observed until a decomposition temperature of the polymer, a concentration of the fluorine-containing aromatic polymer in the solution in which the layer-forming material containing the composition containing the fluorine-containing aromatic polymer is dissolved, a thickness of the polymer layer formed on the base material, and a method for applying the solution of the layer-forming material on the base material are the same as those mentioned above.

As methods for the removal of the solvent of the coating film applied on the base material by heat drying, used may be either method of a method, in which the removal is performed simultaneously with the heating treatment of the polymer layer at a temperature of a glass transition temperature or more of the fluorine-containing aromatic polymer, and a method, in which the solvent is removed by drying at a temperature lower than a glass transition temperature of the fluorine-containing aromatic polymer, and then the polymer layer is subjected to the heating treatment at a temperature of the glass transition temperature or more.

The same base materials as those used in the above-mentioned the laminated body prepared by laminating the composition containing the fluorine-containing aromatic polymer, epoxy compound, and initiator may be used as the base material used in the laminated body prepared by laminating the layer containing the fluorine-containing aromatic polymer whose melting point is not observed until a decomposition temperature of the polymer according to the present invention.

The term "laminated body" used herein means a product prepared by laminating the layer containing the fluorine-containing aromatic polymer on the base material. The laminated layer on the base material may be single layer or two or more of layers formed by different kinds of layers.

It is preferable that the laminated body prepared by laminating the layer containing the fluorine-containing aromatic polymer whose melting point is not observed until a decomposition temperature of the polymer on the base material according to the present invention is used as an adhesive layer. The laminated body prepared by laminating the layer containing the fluorine-containing aromatic polymer whose melting point is not observed until a decomposition temperature of the polymer on the base material according to the present invention is excellent in heat resistance, low hygroscopicity, and adhesion property to the base material. Further, the laminated body becomes more excellent in these properties if being produced by the production method comprising the step of subjecting the laminated body to heating treatment at a temperature of a glass transition temperature or more of the fluorine-containing aromatic polymer. Therefore, such a laminated body can be preferably used as an adhesive agent having heat resistance and low hygroscopicity in addition to as a protective layer of the base material.

It is preferable that each of the fluorine-containing aromatic polymer comprised in the composition containing the fluorine-containing aromatic polymer of the present invention and the fluorine-containing aromatic polymer whose melting point is not observed until a decomposition temperature of the polymer according to the present invention is a fluorine-containing aryl ether polymer. The fluorine-containing aryl ether polymer has heat resistance and low hygroscopicity, but has insufficient adhesion property to a polyimide or a copper foil, which is used in flexible print circuit boards. However, the fluorine-containing aryl ether polymer can have adhesion property to a polyimide or a copper foil, which is used in flexible print circuit boards, without deterioration of heat resistance and the low hygroscopicity, if the fluorine-containing aryl ether polymer forms a composition together with the epoxy compound and the initiator, or if the fluorine-containing aryl ether polymer whose melting point is not observed until an decomposition temperature of the polymer is treated at a temperature of a glass transition temperature or more of the polymer. Therefore, such a fluorine-containing aryl ether polymer can be a material preferably used in flexible print circuit boards.

The composition containing the fluorine-containing aromatic polymer of the present invention and the fluorine-containing aromatic polymer whose melting point is not observed until a decomposition temperature of the polymer according to the present invention can be used as an adhesive component. Therefore, the laminated body of the present invention has an adhesive layer and thereon a polyimide or a copper foil can be attached. A material prepared by laminating the composition or the polymer on the polyimide or the copper foil serves as a cover lay film or a copper foil with resin. The present invention includes: such a copper-clad plate prepared using the composition containing the fluorine-containing aromatic polymer of the present invention, wherein the copper-clad plate has a layer structure of a copper foil, a layer containing the fluorine-containing aromatic polymer, and a polyimide layer; and such a copper-clad plate prepared using the fluorine-containing aromatic polymer whose melting point is not observed until a decomposition temperature of the polymer, wherein the copper-clad plate has a layer structure of a copper foil, a layer containing the fluorine-containing aromatic polymer, and a polyimide layer. Such copper-clad plates have potential for high reliability because the composition containing the fluorine-containing aromatic polymer of the present invention and the fluorine-containing aromatic polymer whose melting point is not observed until a decomposition temperature of the polymer according to the present invention have heat resistance, low hygroscopicity, and electric insulation.

If the adhesive layer is formed by the layer-forming material containing high proportion of fluorine-containing aromatic polymer, the adhesive layer can be peeled from the base material if being immersed in a soluble solvent again because the fluorine-containing aromatic polymer is soluble in the solvent, depending on the ratio of the fluorine-containing aromatic polymer to the epoxy compound in the layer-forming material containing the composition containing the fluorine-containing aromatic polymer. If the adhesive layer is formed by the layer-forming material containing high proportion of epoxy compound, the adhesive layer is not peeled from the base material by the solvent immersion. Therefore, the adhesive layer formed of the layer-forming material comprising the composition containing the fluorine-containing aromatic polymer of the present invention, the composition containing the fluorine-containing aromatic polymer, the epoxy compound, and the initiator, can be used as a temporary fixer, depending on the content of the components.

If the adhesive layer of the polymer is formed on various base materials, as mentioned above, the step is performed on the base material, in which the solution of the polymer is applied on the base material and then the solvent is dried by heating. If the fluorine-containing aromatic polymer is formed into a film like the adhesive film containing the fluorine-containing aromatic polymer whose melting point is not observed until a decomposition temperature of the polymer according to the present invention, the film is attached to a base material, and thereby a layer having adhesion property can be formed on the base material without heating and the like for removal of the solvent, which is needed at preparation of the adhesive layer on the base material. Such an adhesive film can be used as a film for attaching the same kind or different kinds of base materials such as a polyimide and a copper foil to each other. The adhesive film containing the fluorine-containing aromatic polymer whose melting point is not observed until a decomposition temperature of the polymer may contain another material as long as the adhesive film contains the fluorine-containing aromatic polymer whose melting point is not observed until a decomposition temperature of the polymer.

The above-mentioned adhesive film can be prepared by methods, in which a material containing the fluorine-containing aromatic polymer is dissolved in a solvent to prepare a solution, and the prepared solution is applied to a base material for preparation of films to form a coating film, and then the coating film is dried to remove the solvent, as in the above-mentioned formation of the polymer layer on the base material. The solvent for dissolving the material containing the fluorine-containing aromatic polymer, the thickness of the adhesive film, and the method for applying the solution of the material containing the fluorine-containing aromatic polymer on the base material are the same as the solvent, the thickness of the polymer layer, and the method for applying the polymer solution mentioned in the formation of the polymer layer on the base material.

Methods, in which the coating film is preliminary dried and then peeled from the base material, and then subjected to heating dry (after heat) to prepare a film, are preferred for the above-mentioned drying of the coating film of the material solution containing the fluorine-containing aromatic polymer and the solution being applied on the base material. In the preliminary drying, the coating film will be dried until the solvent remains to some extent, so that the total solvent is not volatilized from the coating film. If the total solvent is volatilized with the attachment of the coating film to the base material, the coating film may be distorted or peeled from the base material at the drying. The residual amount of the solvent after the preliminary drying is preferably 3 to 20%. If the residual amount of the solvent is less than 3%, the coating film is easy to peel from the base material at one time, and thereby the film prepared after the peeling may be easily distorted. If the residual amount of the solvent is more than 20%, the coating film is difficult to peel from the base material, and the peeled film may be extended at the heating dry (after heat), possibly resulting in nonuniform of the thickness. The residual amount of the solvent after the preliminary drying is more preferably 5 to 15%.

The heating temperatures at the above-mentioned preliminary drying of the coating film and at the above-mentioned after heat of the peeled film are appropriately determined depending on thickness of the film, kind of the used solvent or the like. The heating temperature at the preliminary drying is preferably 30° C. or more and 150° C. or less, and more preferably 50° C. or more and 120° C. or less. The heating temperature at the after heat is preferably 80° C. or more and 200° C. or less, and more preferably 120° C. or more. The heating time for the preliminary drying is preferably 1 minute or more, and more preferably 3 minutes or more. The after heat may be performed under any conditions as long as the heating dry is performed. However, the after heat is preferably performed under conditions such that the residual amount of the solvent is 1% or less in the film. In the after heat, the solvent may be removed by one-time after heat, or in several stages. In the after heat is performed in several stages, the drying temperatures are the same or different between the stages. The heating time for the after heat is preferably 5 minutes or more, and more preferably 10 minutes or more.

The after heat may be performed simultaneously with the heating treatment of the adhesive film at a temperature of a glass transition temperature or more of the fluorine-containing aromatic polymer, or may be performed separately before the heating treatment at a temperature of a glass transition temperature or more of the fluorine-containing aromatic polymer. However, it is preferable that the after heat is performed before the heating treatment of the adhesive film because, at the time of the adhesion, the film having less residual amount of the solvent is preferable in order to exhibit excellent adhesion property for use as the adhesive film.

The above-mentioned base material for preparation of films, to which the solution of the fluorine-containing aromatic polymer is applied, is not especially limited. Examples of such a base material include glass base materials; plastic base materials, such as a plastic film; and metallic base materials, such as a stainless steel belt, a stainless steel drum, a copper foil. Among them, the plastic base materials, such as a plastic film; and the metallic base materials, such as a stainless steel belt, a stainless steel drum, a copper foil are preferably used.

Examples of such a plastic film include films formed of polyolefines such as polyethylenes, polypropylenes, poly(4-methyl pentyne 1), polyimides, polyamidoimides, polyamides, polyether imides, polyetheretherketones, polyketone sulfides, polyether sulfones, polysulfones, polyphenylene sulfides, polyphenylene oxides, polyethylene terephthalates, polybutylene terephthalates, polyethylenenaphthalates, polyacetals, polycarbonates, polyarylates, acrylic resins, polyvinyl alcohols, polypropylenes, cellulose plastics, epoxy resins, and phenol resins.

Preferably used may be plastic films having heat resistance of 100° C. or more, such as polyethylene terephthalate, polyethylenenaphthalate, and imides such as polyimides, polyamidoimides, and polyether imides among the above-mentioned plastic films as the base material. If a plastic film having low heat resistance is used as the base material, the plastic film may be distorted by heating at the drying of the coating film. If a polyethylene terephthalate and the like is used as the base material, the polyethylene terephthalate and the like subjected to no adhesion treatment is preferably used. If a plastic film subjected to the adhesion treatment is used as the base material, depending on kind of the adhesion treatment, the fluorine-containing aryl ether polymer may exhibit adhesion property to the base material from which the coating film is peeled, possibly resulting in unsuccessful of the peeling.

The above-mentioned plastic film as the base material has a thickness of 30 μm or more. If the plastic film has a thickness of 30 μm or less, the plastic film may generate defects in the production step, such as breakage or damage at the production. The thickness is more preferably 50 μm or more, and still more preferably 80 μm or more.

It is preferable that the above-mentioned adhesive film is subjected to heating treatment at a temperature of a glass transition temperature or more of the fluorine-containing aromatic polymer. The adhesive film can have more excellent adhesion property to various base materials for which the fluorine-containing aromatic polymer is used in electronic material fields, if the adhesive film is subjected to heating treatment at a temperature of a glass transition temperature or more of the fluorine-containing aromatic polymer, as mentioned above.

In the above-mentioned adhesive film, it is preferable that the fluorine-containing aromatic polymer is a fluorine-containing aryl ether polymer. If the fluorine-containing aromatic polymer is a fluorine-containing aryl ether polymer, the above-mentioned adhesive film can exhibit excellent adhesion property also to a polyimide, a copper foil, or the like.

If the laminated body prepared by laminating the polymer layer containing the fluorine-containing aromatic polymer on the base material according to the present invention and the material prepared by attaching the adhesive film of the present invention to the base material is immersed in solvents again, the polymer layer or the adhesive film can be peeled from the base material because the fluorine-containing aromatic polymer is soluble in solvents. Therefore, the polymer layer containing the fluorine-containing aromatic polymer and the adhesive film of the present invention can be used also as a temporary fixer for materials.

The fluorine-containing aryl ether polymer is preferable as the fluorine-containing aromatic polymer which is a constitutional element of the composition containing the fluorine-containing aromatic polymer of the present invention and the fluorine-containing aromatic polymer which constitutes the polymer layer constituting the laminated body of the present invention, as mentioned above. The fluorine-containing aryl ether polymer may contain another structure as long as the polymer contains a fluorine atom and a repeating unit in which the main chain of the repeating unit essentially has an aryl ether structure. The fluorine-containing aryl ether polymer may contain two or more kinds of repeating units having different fluorine-containing aryl ether structures. In this case, the repeating units may be polymerized randomly or in block. The number of the fluorine atom in the repeating unit or the position, to which the fluorine atom is bonded, is not limited. However, it is preferable that the repeating unit has a structure, in which part of the hydrogen atom in an aromatic ring in the aryl ether structure is substituted with the fluorine atom. More preferably, the repeating unit has, in the aryl ether structure, an aromatic ring, in which all the hydrogen atoms are substituted with the fluorine atoms. The fluorine atom substituted with hydrogen atom in alkyl group has the tendency to influence in compatibility with solvent, but the fluorine atom substituted with hydrogen atom in aryl group has little tendency to influence in such compatibility.

The number average molecular weight (Mn) of the above-mentioned fluorine-containing aryl ether polymer is appropriately determined depending on needed properties, applications, or the like. The number average molecular weight is preferably 50000 or more and 500000 or less, and more preferably 10000 or more and 200000 or less. The number average molecular weight can be measured with GPC (manufactured by TOSOH Corp., HLC-8120GPC), polystyrene as standard sample, and THF as a developing solvent.

The fluorine-containing aryl ether polymer in the present invention is a polymer containing an aromatic ring and an ether bond and essentially containing a fluorine atom. The bond order or the position, to which the fluorine atom is bonded, is not especially limited. However, the fluorine-containing aryl ether polymer of the present invention preferably is a polymer essentially containing a repeating unit constituted by an aromatic ring and an ether bond, and containing a fluorine atom in at least one aromatic ring in the repeating unit. Among them, it is more preferable that the fluorine-containing aryl ether polymer of the present invention is a polymer having a repeating unit with a structure represented by the following formula (4);

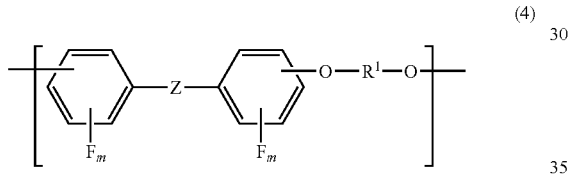

(4)

in the formula, z represents a divalent organic group or a direct bond; each of m may be the same or different and represents the number of the fluorine atom added to the aromatic ring and an integer of 1 to 4; $R^1$ is a divalent organic group, and/or the following formula (5);

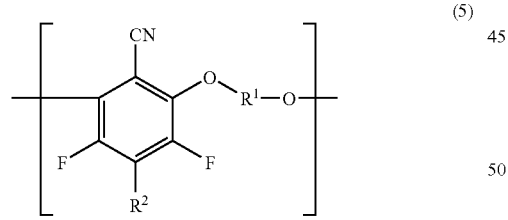

(5)

in the formula, $R^1$ is a divalent organic group; each of $R^2$ may be the same or different and represents an alkyl group having 1 to 12 carbon atoms and optionally having a substituent group, an alkoxyl group having 1 to 12 carbon atoms and optionally having a substituent group, an alkylamino group having 1 to 12 carbon atoms and optionally having a substituent group, an aryloxy group having 6 to 20 carbon atoms and optionally having a substituent group, an arylamino group having 6 to 20 carbon atoms and optionally having a substituent group, or an arylthio group having 6 to 20 carbon atoms and optionally having a substituent group.

These repeating units may be the same or different. If the repeating units are constituted by different repeating units, the repeating units may be arranged randomly or in block. The composition containing the fluorine-containing aryl ether polymer essentially containing such repeating units is excellent in various properties, such as high heat resistance and low hygroscopicity. If the fluorine-containing aryl ether polymer contains both the repeating unit containing the fluorine-containing aryl ether keton structure and the repeating unit containing the fluorine-containing aryl ether nitrile structure, the constitutional ratio of one repeating unit to the other is not especially limited.

The above-mentioned repeating unit having the structure represented by the formula (4) is mentioned below.

In the above formula (4), the divalent organic group represented by $R^1$ includes groups represented by the followings (6-1) to (6-19).

(6-1)

(6-2)

(6-3)

(6-4)

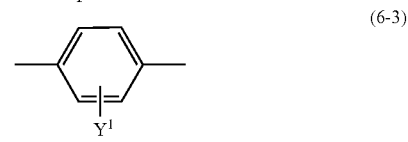

(6-5)

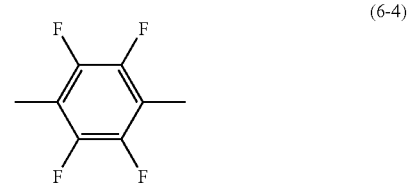

(6-6)

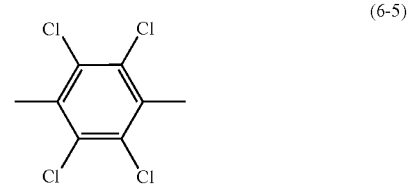

(6-7)

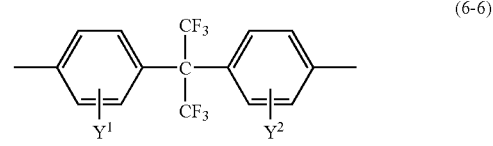

(6-8)

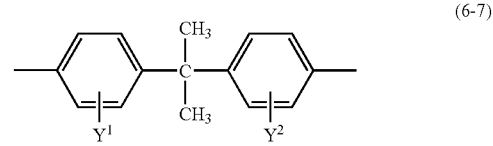

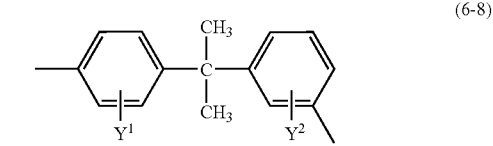

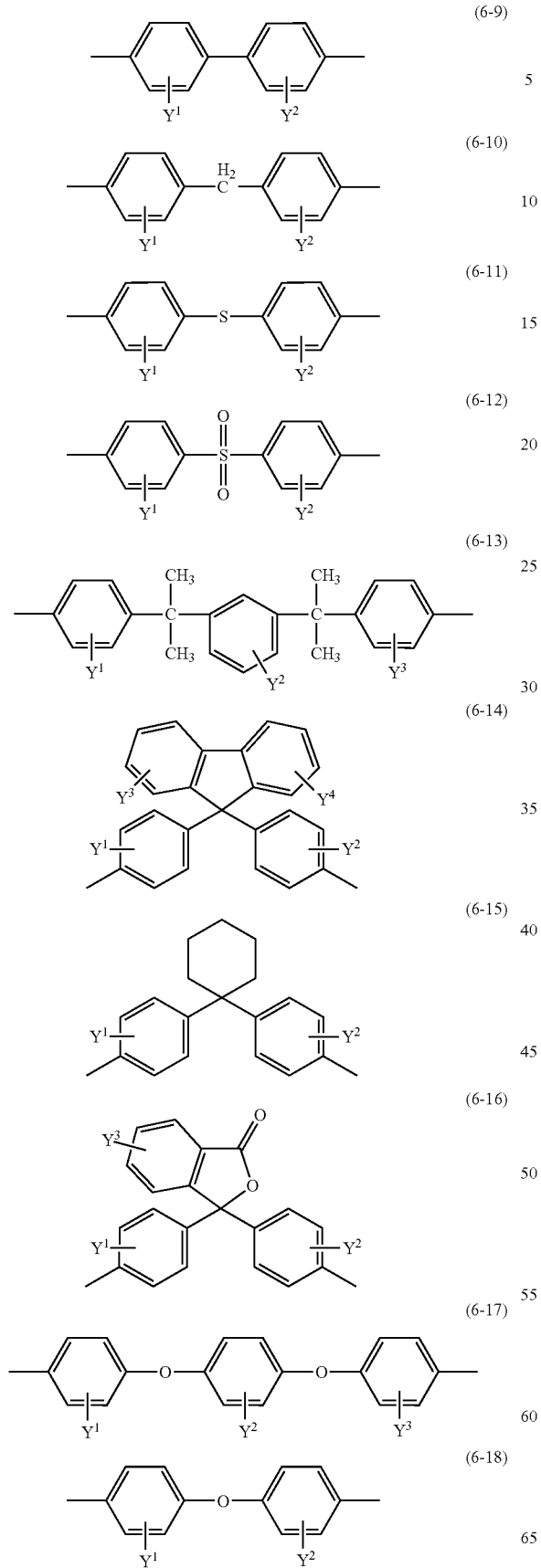
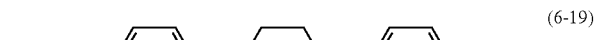

In the above (6-1) to (6-19), an alkyl group optionally having a substituent group and an alkoxy group optionally having a substituent group are preferable as substituent groups in $Y^1$, $Y^2$, $Y^3$, and $Y^4$, for example. An alkyl group having 1 to 30 carbon atoms and optionally having a substituent group or an alkoxy group having 1 to 30 carbon atoms and optionally having a substituent group are more preferable. Among them, the following groups represented by the followings (7-1) to (7-20) are more preferred as $R^1$.

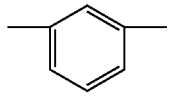
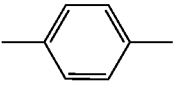
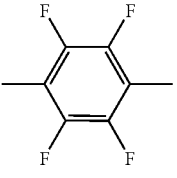
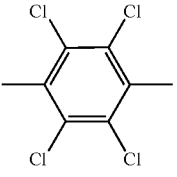
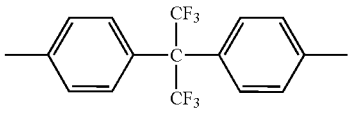
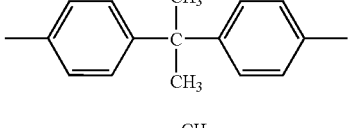
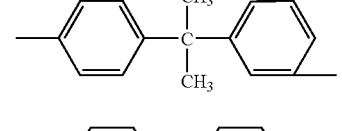
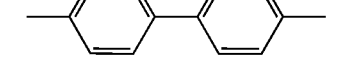

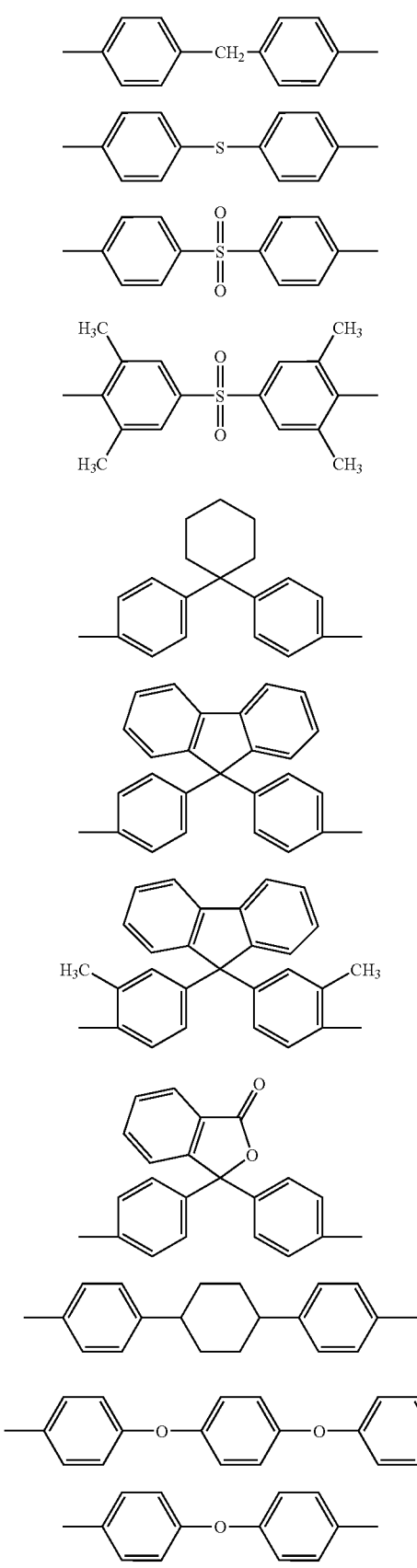
In the above formula (4), z represents a divalent organic group or a direct bond of benzen rings. Such a divalent organic group preferably contains C, S, N and/or C atom(s). Such a divalent organic group more preferably contains a carbonyl group, a methylene group, a sulfide group, a sulfone group, a heterocycle, and the like. The followings (8-1) to (8-17) are more preferable, for example.
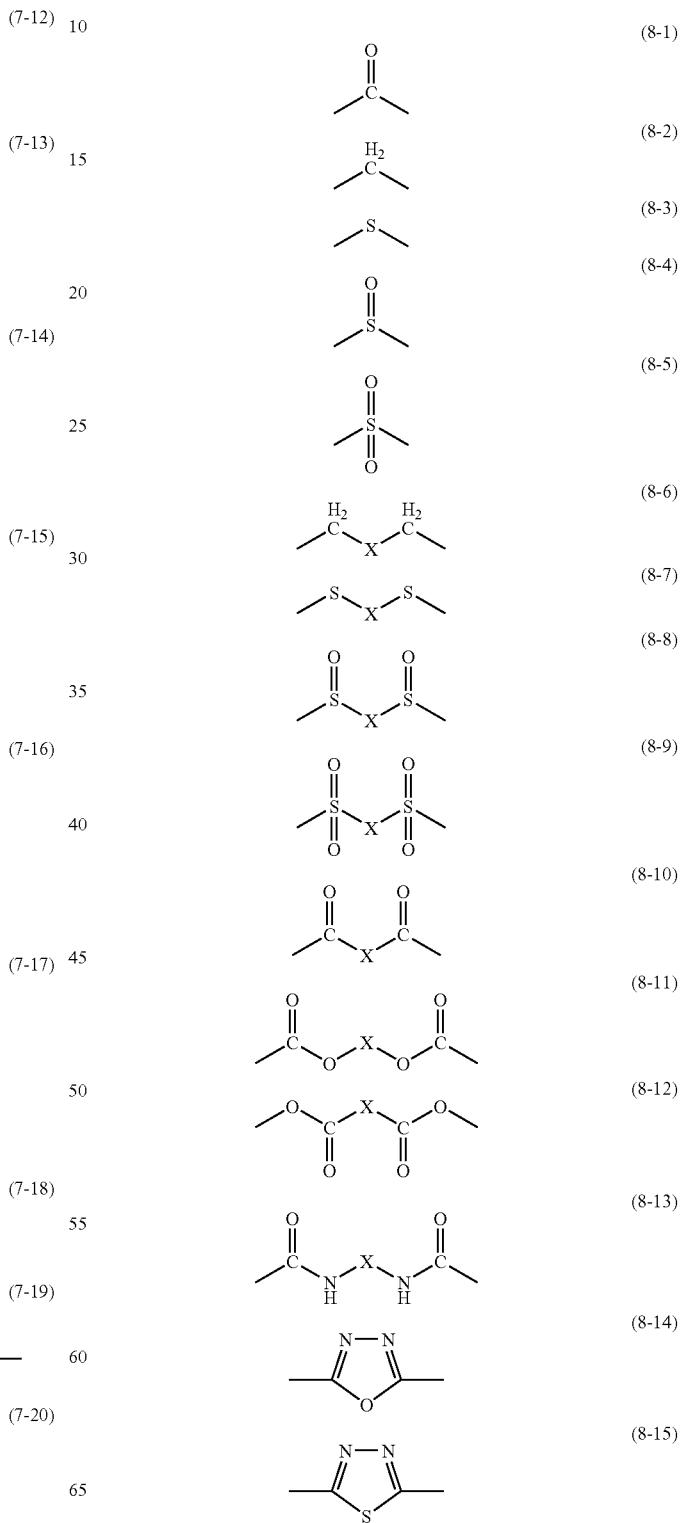

-continued

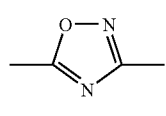

(8-16)

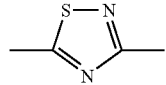

(8-17)

In the above (8-1) to (8-17), x is the above (6-1) to (6-19), for example. The fluorine-containing aryl ether polymer of the present invention preferably contains a repeating unit with a fluorine-containing polyaryl ether ketone structure, among the polymers mentioned above. More preferably, the fluorine-containing polyaryl ether polymer of the present invention has a repeating unit with a structure represented by the following formula (9).

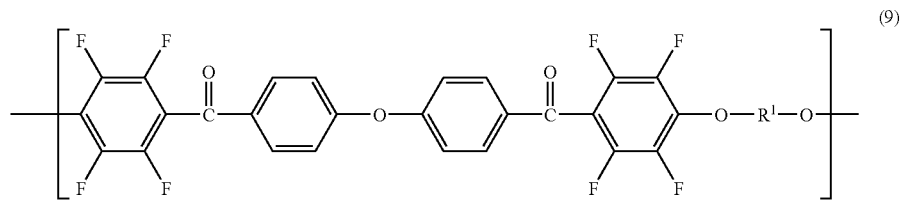

(9)

The above-mentioned repeating unit having the structure represented by the formula (5) is mentioned below. In the above formula (5), the divalent organic group represented by $R^1$ includes the above (6-1) to (6-19) and the like. In the above (6-1) to (6-19), an alkyl group optionally having a substituent group or an alkoxy group optionally having a substituent group are preferable as substituent groups in $Y^1$, $Y^2$, $Y^3$, and $Y^4$, for example. An alkyl group having 1 to 30 carbon atoms and optionally having a substituent group or an alkoxy group having 1 to 30 carbon atoms and optionally having a substituent group are more preferable. Among them, the above (7-1) to (7-20) are more preferred as $R^1$.

In the above formula (5), each of $R^2$ may be the same or different and represents an alkyl group having 1 to 12 carbon atoms and optionally having a substituent group, an alkoxyl group having 1 to 12 carbon atom and optionally having a substituent group, an alkylamino group having 1 to 12 carbon atoms and optionally having a substituent group, an aryloxy group having 6 to 20 carbon atoms and optionally having a substituent group, an arylamino group containing 6 to 20 carbon atoms and optionally having a substituent group, or an arylthio group having 6 to 20 carbon atoms and optionally having a substituent group.

Preferable examples of such an alkyl group include methyl, ethyl, propyl, isopropyl, butyl, isobutyl, sec-butyl, tert-butyl, pentyl, isopentyl, neopentyl, hexyl, heptyl, octyl, nonyl, decyl, undecyl, dodecyl, and 2-ethylhexyl group.

Preferable examples of such an alkoxy group include methoxy, ethoxy, propoxy, isopropoxy, butoxy, pentyloxy, hexyloxy, 2-ethylhexyloxy, octyloxy, nonyloxy, decyloxy, undecyloxy, dodecyloxy, furfuryloxy, and allyloxy group.

Preferable examples of such an alkylamino group include methylamino, ethylamino, dimethylamino, diethylamino, propylamino, n-butylamino, sec-butylamino, and tert-butylamino group.

Preferable examples of such an aryloxy group include phenoxy, benzyloxy, groups derived from hydroxybenzoic acid and its esters (e.g. methyl ester, ethyl ester, methoxyethyl ester, ethoxyethyl ester, furfuryl ester, and phenyl ester), naphthoxy, o-, m-, or p-methylphenoxy, o-, m-, or p-phenylphenoxy, phenylethinylphenoxy group, and groups derived from cresotinic acid and its esters.

Preferable examples of such an arylamino group include anilino, o-, m-, or p-toluidino, 1,2- or 1,3-xylidino, o-, m- or p-methoxyanilino group, and groups derived from anthranilic acid and its esters.

Preferable examples of such an arylthio group include phenylthio, phenylmethanethio, o-, m-, or p-tolylthio group, and groups derived thiosalicylic acid and its esters.

Among them, alkoxy, aryloxy, arylamino, and arylthio group, each optionally having a substituent group, are preferred as the above $R^2$. $R^2$ may or may not have a double or triple bond.

The substituent group in the above $R^2$ is preferably the alkyl group having 1 to 12 carbon atoms as described above; a halogen atom such as fluorine, chlorine, bromine, and iodine; cyano, nitro, and carboxy ester groups. Hydrogen atom of these substituent groups may or may not be substituted with a halogen atom. Among them, halogen atom, and methyl, ethyl, propyl, isopropyl, butyl, pentyl, hexyl, and carboxyester groups, which each may or may not have halogen atoms substituted with hydrogen atoms are preferable.

The fluorine-containing aryl ether polymer essentially containing the repeating unit represented by the above formula (4) and/or the repeating unit represented by the above formula (5) of the present invention can be produced, for example, by methods described in Japanese Kokai Publication No. 2001-64226 or Japanese Kokai Publication No. 2002-12662.

The composition containing the fluorine-containing aromatic polymer of the present invention has the above-mentioned constitution, and has high solubility in various solvents. And the film prepared using the composition on the base material has low hygroscopicity and excellent heat resistance, electric insulation, and adhesion property to the base material. Therefore, the film can be preferably used as an adhesive agent in addition to as a protective layer of various circuit boards used in electronic material fields.

The laminated body prepared by laminating the layer containing the fluorine-containing aromatic polymer of the present invention on the base material has the above-mentioned constitution. The composition has low hygroscopicity and excellent heating resistance and adhesion property to the base material, and the composition can be used as an adhesive layer. Therefore, the laminated body can be preferably used as an adhesive agent in addition to as a protective layer of various circuit boards used in electron material fields.

The production method of the laminated body of the present invention has the above-mentioned constitution, and can make the various properties of the laminated body of the present invention more excellent. The production method of the laminated body of the present invention is a production method for producing the laminated body preferably used as an adhesive agent in addition to as a protective layer of various circuit boards used in electronic material fields.

BEST MODE FOR CARRYING OUT THE INVENTION

The present invention is described in more detail below with reference to Examples, but the present invention is not limited to the following Examples.

Examples 1 and 2 and Comparative Examples 1 and 2

A toluene solution of a composition prepared by mixing a fluorine-containing polyaryl ether ketone B (F·PEK-B), YD-128 as an epoxy resin (tradename, product of Tohto Kasei Co., Ltd.), CELLOXIDE 2021 (tradename, product of Daicel Chemical Industries, Ltd.), and San-Aid SI-60 as an initiator (tradename, SANSHIN CHEMICAL INDUSTRY Co., Ltd.) at ratios shown in Table 1 was applied on a Kapton film (tradename, product of DuPont-Toray, Co., Ltd.) (50 μm) as a polyimide film with a bar coater. The film, on which the solution of the composition was applied, was dried by heating at 80° C. for 10 minutes, and then dried by heating at 170° C. for 60 minutes to prepare a polyimide film on which the composition in Example 1 was applied. Polyimide films, on which compositions in Example 2, Comparative Examples 1 and 2 were applied respectively, were prepared in the same manner as in the polyimide film containing the composition in Example 1 except that the polyimide film was prepared by heating at 80° C. for 10 minutes, and then by heating at 150° C. for 60 minutes in the polyimide films containing the composition in Example 2 and Comparative Example 2. Each of the compositions in Example 2, Comparative Examples 1 and 2 comprises a component (components) shown in Table 1. Each of the F·PEK-B and the fluorine-containing polyaryl ether nitrile C (F·PEN-C) is a polymer essentially containing a repeating unit with the following structure. Tg of F·PEK-B and F·PEN-C measured with DSC was 242° C. and 160° C. respectively.

These films were measured for adhesion property through cellophane-tape peeling test and then evaluated. Table 1 shows results.

In addition to the above-mentioned films, films of the composition in Example 1 and films of the composition in Example 2 were prepared and measured for water absorption ratio. The film in Example 1 mainly contained F·PEK-B, and the film in Example 2 mainly contained F·PEN-C. The films were measured for absorption ratio, which showed that each of the films has an absorption ratio of 0.1% or less. The above result shows that each of the compositions on the films in Example 1 and 2 has low absorption property and excellent heat resistance. The measurement methods of the film thickness, heat resistance, and water absorption ratio are shown below.

TABLE 1

|  | Example 1 | Example 2 | Comparative Example 1 | Comparative Example 2 |
|---|---|---|---|---|
| F·PEK-B | 80 parts | — | 100 parts | — |
| F·PEN-C | — | 80 parts | — | 100 parts |
| YD-128 | 10 parts | 10 parts | — | — |
| CELLOXIDE 2021 | 10 parts | 10 parts | — | — |
| San-Aid SI-60 | 0.6 parts | 0.6 parts | — | — |
| Total | 100.6 parts | 100.6 parts | 100 parts | 100 parts |
| Coating condition | Bar coater | Bar coater | Bar coater | Bar coater |
| Film thickness | About 10 μm | About 10 μm | About 10 μm | About 10 μm |
| Adhesion property | No peeling | No peeling | Interfacial peeling | Interfacial peeling |

Example 3 and Comparative Example 3

A toluene solution containing the composition in Example 1 was applied on a copper foil with a bar coater. The applied solution was dried by heating at 80° C. for 10 minutes, and then dried by heating at 170° C. for 60 minutes to prepare a copper foil on which the composition in Example 1 was placed. Copper foil, on which composition in Comparative Example 1 was applied was prepared in the same manner as in the copper foil on which the composition in Example 1 was placed. The adhesion property of copper foil was evaluated through cellophane-tape peeling test. Table 2 shows results.

TABLE 2

|  |  | Example 3 | Comparative Example 3 |
|---|---|---|---|
| Coating condition |  | Bar coater | Bar coater |
| Adhesion property | Mirror surface | No peeling | Interfacial peeling |
|  | Rough surface | No peeling | Partly peeling |

Example 4

A Kapton, on which the composition in Example 1 was placed, was placed on the rough surface of a rolled copper foil and then the laminated body was thermally pressure-bonded at 240° C. for 1 hour. The prepared material consisted of the Kapton, the mixed composition, and the copper foil was evaluated for peeling property in a direction of 90° of between the copper foil and the Kapton. The polyimide film was broken.

Example 5

The material consisted of the Kapton, the mixed composition, and the copper foil, which was obtained in Example 4, was immersed in aceton. The material was left for a while and then peeled. The Kapton was finely peeled from the copper foil.

Examples 6 to 8 and Comparative Examples 4 to 6

A polyimide film (sample A) in Example 6 was prepared in the following manner. A 25% solution prepared by dissolving a fluorine-containing polyaryl ether keton A (F·PEK-A) in a mixed solvent of methyl ethyl keton (MEK) and toluene was applied on a Kapton film (tradename, product of DuPont-Toray, Co., Ltd.) (50 μm) as a polyimide film with a bar coater. The film, on which F·PEK-A solution was applied, was dried by heating at 80° C. for 10 minutes, and then dried by heating at a predetermined temperature shown in Table 3 for 60 minutes to prepare a polyimide film (sample A) on which F·PEK-A was placed. A polyimide film (sample B) on which the fluorine-containing polyaryl ether keton B (F·PEK-B) was placed, and a polyimide film (sample C) on which the fluorine-containing polyaryl ether nitrile C (F·PEN-C) was placed, were prepared in the same manner as in the polyimide film (sample A). These polymers, F·PEK-A, F·PEK-B, and F·PEN-C, were measured for melting point. However, no melting peak was observed in each of the polymers until decrease in weight was started. These polymers were the polymers whose melting point was not observed until the decomposition temperature. The measurement method of the melting point is shown below.

Each of the F·PEK-A, F·PEK-B, and F·PEN-C had a film thickness of about 12 µl. Each of the film thickness was determined by subtracting the film thickness of the Kapton film as the base material from the film thickness of the prepared polyimide film.

The adhesion property of the polyimide films (samples A to C) were evaluated through cellophane-tape peeling test. The F·PEK-A, F·PEK-B, and F·PEN-C were measured for glass transition temperature and water absorption ratio. Table 3 shows results. The measurement methods of the film thickness, the heat resistance, and the water absorption ratio are shown below. Each of the F·PEK-A, F·PEK-B, and F·PEN-C is a polymer essentially containing a repeating unit with the following structure.

[Melting Point]
The melting point was measured with TG-DTA (manufactured by Shimadzu Corp. DTG-50) at 1° C./minute under nitrogen atmosphere.

[Film Thickness]
The film thickness was measured with a micrometer (manufactured by ERICHSEN Corp.). The polyimide films, on which the composition such as F·PEK-A was applied, were measured for thickness.
Then, the thickness (50 µm) of the polyimide film as the base material was subtracted from the determined thickness and then, the film thickness of the composition on the base material was determined.

[Glass Transition Temperature]
The glass transition temperature was measured with a differential scanning calorimeter (produced by SEIKO INSTRUMENT Inc. DSC6200) at 20° C./minute under nitrogen atmosphere.

[Water Absorption Ratio]
In each of Examples 1 and 2, a toluene solution containing the composition in Example 1 or 2 was applied on a polyimide film and the polyimide film on which the composition is applied was dried by heating at 80° C. for 10 minutes. Then, the film formed from the composition was peeled from polyimide base film. Then, the F·PEK-B was cured by heating at 170° C. for 1 hour, and the F·PEN-C was cured by heating at 150° C. for 1 hour. Thereby, the films of the composition in Examples 1 and 2 were prepared.

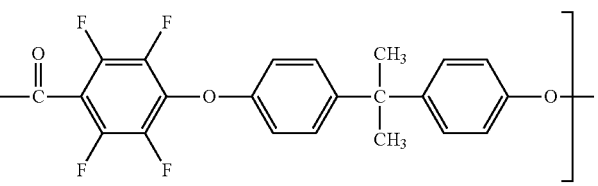

F•PEK-A

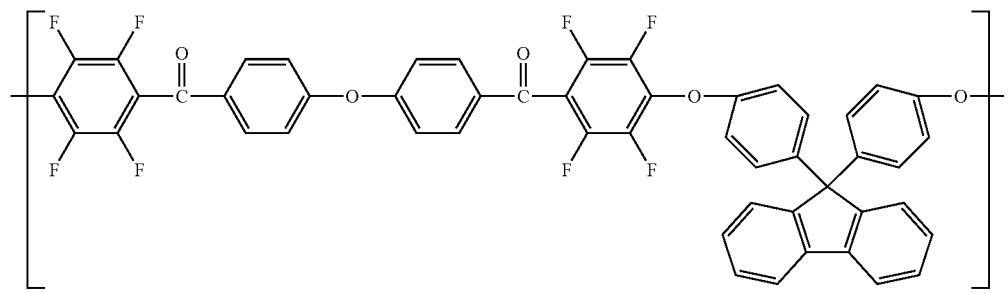

F•PEK-B

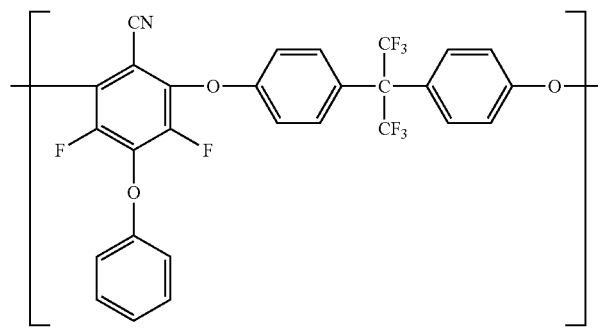

F•PEK-C

In each of Examples 6 to 8, a MEK/toluene solution containing the composition in any of Example 6 to 8 was applied on a polyethylene terephthalate (PET) and the PET film on which the composition is applied was dried at 80° C. for 10 minutes. Then, the film formed from the composition was peeled from the PET base film. Then, the F·PEK-A and the F·PEK-B were dried at 170° C., and the F·PEN-C was dried at 150° C. Thereby, the films of the composition in Examples 6 to 8 were prepared.

The prepared films were measured for dry weight, and then the films were immersed in deionized water for three days. Then, the films after the immersion were measured for weight. Thereby, each water absorption ratio of the films was determined.

TABLE 3

|  | Example 6 | Example 7 | Example 8 | Comparative Example 4 | Comparative Example 5 | Comparative Example 6 |
| --- | --- | --- | --- | --- | --- | --- |
| Examined resin | Sample A | Sample B | Sample C | Sample A | Sample B | Sample C |
| Tg(DSC) | 180° C. | 242° C. | 160° C. | 180° C. | 242° C. | 160° C. |
| Absorption ratio | <0.1% | <0.1% | <0.1% | <0.1% | <0.1% | <0.1% |
| Coating condition | Bar coater | Bar coater | Bar coater | Bar coater | Bar coater | Bar coater |
| Drying condition | 80° C. × 10 minutes 250° C. × 60 minutes | 80° C. × 10 minutes 320° C. × 60 minutes | 80° C. × 10 minutes 240° C. × 60 minutes | 80° C. × 10 minutes 170° C. × 60 minutes | 80° C. × 10 minutes 200° C. × 60 minutes | 80° C. × 10 minutes 150° C. × 60 minutes |
| Film thickness | About 12 μm | About 12 μm | About 12 μm | About 12 μm | About 12 μm | About 12 μm |
| Adhesion property | No peeling | No peeling | No peeling | Interfacial peeling | Interfacial peeling | Interfacial peeling |

Example 9 and Comparative Example 7

A 25% solution of F·PEK-A (a mixed solvent of MEK and toluene was used) was applied on the mirror surface of an electrolytic copper foil (product of MITSUI MINING & SMELTING Co., Ltd.) with a bar coater. The copper foil on which the solution was applied was dried by heating at 80° C. for 10 minutes, and then dried by heating at a predetermined temperature shown in Table 4 for 60 minutes. Thereby, a copper foil on which the F·PEK-A was placed on the mirror surface was prepared. Similarly, a 25% solution of F·PEK-A was applied on the rough surface of an electrolytic copper foil. Thereby, a copper film on which the F·PEK-A was placed on the rough surface was prepared.

Each adhesion property of the films was evaluated through cellophane-tape peeling test. Table 4 shows results.

TABLE 4

|  |  | Example 9 | Comparative Example 7 |
| --- | --- | --- | --- |
| Examined resion |  | Sample A | Sample A |
| Coating condition |  | Bar coater | Bar coater |
| Drying condition |  | 80° C. × 10 minutes 250° C. × 60 minutes | 80° C. × 10 minutes 170° C. × 60 minutes |
| Adhesion property | Mirror surface | No peeling | Interfacial peeling |
|  | Rough surface | No peeling | No peeling |

Example 10

The rough surface of an electrolytic copper foil was placed on the Kapton film in Example 6, on which the F·PEK-A was placed and then the laminated body was thermally pressure-bonded at 250° C. for 1 hour. The prepared copper foil/Kapton was measured for peeling property in a direction of 90° and the polyimide film was broken.

Example 11

A 25% solution of F·PEK-A (mixed solvent of MEK and toluene was used) was applied on a polyethylene terephthalate (PET) with an applicator. The PET on which the solution of F·PEK-A was applied was dried by heating at 80° C. for 10 minutes, and then the film formed from the solution was peeled from the PET. The film was further dried by heating at 170° C. for 60 minutes. Thereby, a film containing the F·PEK-A in 20 μm was prepared. The prepared film was placed between a rolled copper foil (product of NIKKO MATERIALS Co., Ltd.) and a Kapton film (50 μm) and then thermally pressure-bonded at 250° C. for 1 hour. The prepared copper foil/Kapton was measured for peeling property in a direction of 90° and the polyimide film was broken.

Example 12

The material consisted of the Kapton/the F·PEK-A/copper foil, which was prepared in Example 10, was immersed in acetone. The material was left for a while, and then peeled. The Kapton was finely peeled form the copper foil.

The results of Examples 1 to 5 and Comparative Examples 1 to 3 show that use of the composition containing the fluorine-containing aromatic polymer of the present invention makes it possible to prepare a layer of a cured product (a polymer layer) having low hygroscopicity and excellent adhesion property to a base material, and that the layer of the cured product can be used as an adhesive agent to a base material. The fact that the solvent immersion made it possible to easily peel the layer of the composition containing the fluorine-containing aromatic polymer prepared in Example 1 from the base material shows that the composition containing the fluorine-containing aromatic polymer of the present invention can be used also as a temporary fixer by appropriately determining the ratio of the fluorine-containing aromatic polymer to the epoxy compound.

The results of Examples 6 to 12 and Comparative Examples 4 to 7 show that the laminated body, according to the present invention, prepared by laminating the layer containing the fluorine-containing aromatic polymer of the present invention on the base material has low hygroscopicity and has a polymer layer of the fluorine-containing aromatic polymer, the polymer layer exhibiting excellent adhesion property to the base material. This polymer layer can be used as an adhesive agent to a base material and easily peeled from the base material by being immersed in solvents. Therefore, the polymer layer can be used as a temporary fixer for materials.

The present application claims priority to Japanese Patent Application No. 2005-133130 filed Apr. 28, 2005, entitled "Layer forming material containing fluorine-containing aromatic polymer" and Japanese Patent Application No. 2005-132864 filed Apr. 28, 2005, entitled "Composition containing fluorine-containing aromatic polymer". The contents of these applications are incorporated herein by reference in their entirely.

The invention claimed is:

1. A composition containing a fluorine-containing aromatic polymer, wherein the composition comprises a fluorine-containing aromatic polymer, an epoxy compound and an initiator, wherein the initiator is a cation initiator, which is at least one member selected from the group consisting of a diazonium salt compound represented by the following general formula (1), an iodonium salt compound represented by the following general formula (2), and a sulfonium salt compound represented by the following general formula (3);

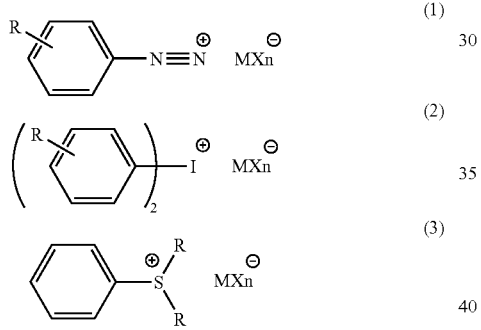

in the formula (1), the formula (2) and the formula (3), R represents an alkyl group or an aromatic group, and MXn represents a counter anion which is $BF_4$, $PF_3$, $AsF_6$, or $SbF_6$, the fluorine-containing aromatic polymer is a fluorine-containing aryl ether polymer, wherein the fluorine-containing aromatic polymer is a polymer having a repeating unit with a structure represented by the following formula (4) and/or the following formula (5);

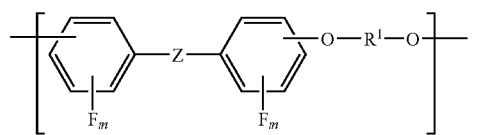

in the formula (4), Z represents a divalent organic group or a direct bond, each of m may be the same or different and represents the number of the fluorine atom added to the aromatic ring and an integer of 1 to 4, and $R^1$ is a divalent organic group;

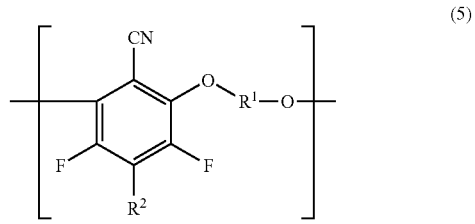

in the formula (5), $R^1$ is a divalent organic group, each of $R^2$ may be the same or different and represents an alkyl group having 1 to 12 carbon atoms and optionally having a substituent group, an alkoxyl group having 1 to 12 carbon atoms and optionally having a substituent group, an alkylamino group having 1 to 12 carbon atoms and optionally having a substituent group, an aryloxy group having 6 to 20 carbon atoms and optionally having a substituent group, an arylamino group having 6 to 20 carbon atoms and optionally having a substituent group, or an arylthio group having 6 to 20 carbon atoms and optionally having a substituent group, wherein the ratio of the fluorine-containing aromatic polymer to the epoxy compound, the fluorine-containing aromatic polymer/the epoxy compound, is 40/60 to 95/5, and the initiator content of the composition is 0.5 to 10% relative to the epoxy compound.

2. A film containing the composition containing the fluorine-containing aromatic polymer according to claim 1.

3. A laminated body prepared by laminating the composition containing the fluorine-containing aromatic polymer according to claim 1 on a base material.

4. The laminated body according to claim 3, wherein a polyimide or a copper film is used as the base material.

5. A copper-clad plate prepared using the composition containing the fluorine-containing aromatic polymer according to claim 1, wherein the copper-clad plate has a layer structure of a copper foil, a layer containing the fluorine-containing aromatic polymer, and a polyimide layer.

6. The composition containing a fluorine-containing aromatic polymer according to claim 1 wherein the molecular weight of the epoxy compound is less than 3000.

7. The composition containing a fluorine-containing aromatic polymer according to claim 1, wherein the ratio of the fluorine-containing aromatic polymer to the epoxy compound, the fluorine-containing aromatic polymer/the epoxy compound, is 80/20 to 95/5.

* * * * *